(12) United States Patent
Tso et al.

(10) Patent No.: US 7,102,393 B2
(45) Date of Patent: Sep. 5, 2006

(54) DETECTION OF A CLOSED LOOP VOLTAGE

(75) Inventors: Vincent S. Tso, Milpitas, CA (US); James B. Ho, San Jose, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 10/956,357

(22) Filed: Sep. 30, 2004

(65) Prior Publication Data

US 2006/0066359 A1 Mar. 30, 2006

(51) Int. Cl.
*H03K 5/22* (2006.01)
*G01R 19/00* (2006.01)

(52) U.S. Cl. .......................................... 327/53; 327/78
(58) Field of Classification Search .................. 327/53, 327/66, 78, 79, 81–82, 89, 562–563; 323/315–316
See application file for complete search history.

(56) References Cited

U.S. PATENT DOCUMENTS

| 5,543,746 A | * | 8/1996 | Kuo ............................. 327/543 |
| 5,598,094 A | * | 1/1997 | Kiehl et al. .................. 323/315 |
| 6,297,685 B1 | * | 10/2001 | Ewen et al. ................. 327/513 |
| 6,339,318 B1 | * | 1/2002 | Tanaka ........................ 323/313 |
| 6,831,501 B1 | * | 12/2004 | Aude .......................... 327/538 |

* cited by examiner

*Primary Examiner*—My-Trang Nu Ton
(74) *Attorney, Agent, or Firm*—Townsend and Townsend and Crew LLP

(57) ABSTRACT

To detect whether a closed-loop's voltage is out of range, a voltage detector includes first and second transistors that deliver first and second currents respectively to first and second high impedance nodes. The voltage detector further includes third and fourth transistors that draw third and fourth currents respectively from the first and second nodes. The first and second currents are scaled replicas of a current flowing through a current source of a voltage-to-current converter that converts the close-loop's voltage to a current and supplies a first voltage to the first and second transistors. The third and fourth currents are scaled replicas of a different current flowing through a current mirror of the voltage-to-current converter and that supplies a second voltage to the third and fourth transistors.

8 Claims, 6 Drawing Sheets

DETECTION OF A CLOSED LOOP VOLTAGE

BACKGROUND OF THE INVENTION

The present invention relates to electronic circuits, and more particularly to detection of a control voltage in a closed loop circuit, such as a phase locked or delay locked loop.

The increasing speed with which multiple types of data, such as text, audio and video, are transported over existing communication networks has brought to the fore the reliability with which such data transportation is carried out. In accordance with one conventional method, to ensure reliable data transfer, the data is first encoded with a reference clock signal at the transmitting end of the network to generate a composite signal. Thereafter, the composite signal is transmitted over the network to the receiving end. At the receiving end, the data and clock signals are recovered from the composite signal to ensure that the data and clock signals remain synchronous with respect to each other.

The clock and data recovery is typically carried out, for example, by a delay locked loop or a phase locked loop. In operation, a phase locked loop maintains a fixed relationship between the phase and frequency of the signal it receives and those of the signal it generates. FIG. 1 is a simplified block diagram of a conventional phase locked loop (PLL) 10 adapted to maintain a fixed relationship between the phase and frequency of signal CLK and signal Ref_Clk. PLL 10 includes, among other components, phase detector 12, charge pump 14, loop filter 16 and voltage controlled oscillator (VCO) 18. The extracted clock signal Clk is supplied at the output terminal of VCO 18. Once in a locked state, the phase and frequency of signal Clk generated by PLL 10 is locked to those of signal Ref_Clk received by PLL 10. The operation of PLL 10 is described further below.

Phase detector 12 receives signals Ref_Clk and Clk, and in response, generates signal A that corresponds to the difference between the phases of these two signals. Charge pump 14 receives signal A and in response generates and delivers to node B a current signal whose duration varies depending on the magnitude of signal A. Loop filter 16 filters out the high frequency components of signal I and delivers a filtered-out voltage signal to VCO 18.

If signal Ref_Clk leads signal Clk in phase—indicating that the VCO is running relatively slowly—signal A causes charge pump 14 to increase its output current until VCO 18 achieves an oscillation frequency at which signal Clk is frequency-locked and phase-locked with signal Ref_Clk. If, on the other hand, signal Ref_Clk lags signal Clk in phase—indicating that the VCO is running relatively fast—signal A causes charge pump 14 to reduce its output current until VCO 18 achieves an oscillation frequency at which signal Clk is frequency-locked and phase-locked with signal Ref_Clk. Signal Clk is considered to be locked to signal Vref if its frequency is within a predetermined frequency range of signal Ref_Clk. Signal Clk is considered to be out-of-lock with signal Ref_Clk if its frequency is outside the predetermined frequency range of signal Ref_Clk.

FIG. 2 is a simplified block diagram of another conventional PLL 30 that includes, among other components, phase/frequency detector 32, charge pump 34, loop filter 36, voltage to current (VTI) converter 38, current controlled oscillator (ICO) 40, and out-of-range voltage detection circuitry 42. In PLL 30, voltage Vcont is generated by charge pump 34. Out-of-range voltage detection circuitry 42 is adapted to detect whether voltage Vcont is within a range defined by voltage Vbg. Determination of voltage Vcont provides insight into the loop dynamics, enables control of the loop voltage, and allows PLL 30 to be calibrated. In response, voltage detection circuitry 42 generates voltage signals Vcom1 and Vcom2. VTI converter 38, using voltage Vref, converts the voltage Vcont to a current I, and delivers this current to ICO 40.

FIG. 3 is a transistor schematic diagram of VTI circuit 38, as known in the prior art. VTI circuit 38 is shown as including a differential amplifier formed by NMOS transistors 120, 122 and resistor 118, current source 200, current mirrors 205, 210, 215, 220, 225, and biasing transistor 106. Assume current source 200, which is a cascade current source generates a current of 2I that flows through PMOS transistors 102, 104. Current mirrors 205, 220, and 225 mirror this current, and therefore, a current of 2I also flows through PMOS transistors 108, 128, and 130. Part of the current 2I mirrored in transistor 128 flows through PMOS transistor 124—shown as current I+DI—the remainder of this current flows through transistor 120—shown as current I−DI. Similarly, part of the current 2I mirrored in transistor 130 flows through PMOS transistor 126—shown as current I−DI—the remainder of this current flows through transistor 122—shown as current I+DI. Because the same current flows through both PMOS transistor 124 and NMOS transistor 132, a current of I+DI flows through transistor 132. Moreover, because the same current flows through NMOS transistors 132, and 134, a current of I+DI flows through transistor 134.

NMOS transistors 114, and 116 are scaled relative to NMOS transistor 112, such that each conduct a current of I. If voltage Vcont is greater than voltage Vref, more current, e.g., I+DI flows through transistor 122 and less current, e.g., I−DI flows through transistor 120. Similarly, if voltage Vcont is smaller than voltage Vref, more current flows through transistor 120 and less current flows through transistor 122. Because the current through transistors 114 and 116 is adapted to be I, a current of DI flows through resistor 118 and transistor 116. It is understood that depending on the relative sizes of voltages Vcont and Vref, shown current DI may have a positive or a negative value. The difference 2DI between current I−DI flowing through transistor 126 and current of I+DI flowing through transistor 134, flows to terminal Icntl if current DI is negative, or from terminal Icntl if DI is positive. Therefore, the difference between voltages Vcont and Vref, results in change in the current 2DI flowing into or out of terminal Icntl.

FIG. 4 shows the change in the current flowing through terminal Icntl as a function of the difference between voltages Vcnt and Vref. The current flow through terminal Icnt varies linearly as a function of the difference between voltages Vcnt and Vref, so long as this voltage difference is between ±Vd. A constant current of 2I flows through this terminal if the magnitude of the difference between voltages Vcnt and Vref exceeds Vd.

FIG. 5 is a schematic diagram of voltage detection circuitry 42, as known in the prior art. Band-gap voltage generator 52 generates reference voltage Vbg that is applied to positive input terminal Inp of operational amplifier (op-amp) 54. The output voltage of op-amp 54 is applied to the gate terminal of PMOS transistor 60. Upper boundary voltage Vcom_hi is applied to the positive input terminal Inp of voltage comparator 66, and lower boundary voltage Vcom_lo is applied to the positive input terminal Inp of voltage comparator 68. Voltage signal Vcont is applied to the negative input terminals Inn of both voltage comparators 66 and 68. If voltage Vcont is greater than voltage Vcom_hi, output signals Vcom1 and Vcom2 make a high-to-low transition. If voltage Vcont is smaller than voltage Vcom_lo, output signals Vcom1 and Vcom2 make a low-to-high transition. If voltage Vcont is between voltages Vcom_lo and Vcom_hi, output signal Vcom1 remains high and output signal Vcom2 remains low.

As seen from FIG. 5, out-of-range detection circuitry 42 requires, among other components, one op-amp, two voltage comparators, as well as a band-gap circuit. Therefore, out-of-range detection circuitry 42 is relatively large, i.e., consumes a relatively large semiconductor surface area, and also consumes a relatively large power.

BRIEF SUMMARY OF THE INVENTION

To detect whether a closed-loop voltage, such as the closed-loop voltage of a PLL or DLL, is out of range, a voltage detector includes first and second transistors that deliver first and second currents respectively to first and second high impedance nodes. The voltage detector further includes third and fourth transistors that draw third and fourth currents respectively from the first and second nodes. The first and second currents are scaled replicas of a current flowing through a current source of a voltage-to-current converter that converts the close-loop voltage to a current and supplies a first voltage to the first and second transistors. The third and fourth currents are scaled replicas of a different current flowing through a current mirror of the voltage-to-current converter and that supplies a second voltage to the third and fourth transistors.

The first transistor has a gate terminal that receives a first voltage generated by the voltage-to-current converter and, in response, generates a first current that is equal to a scaled replica of the first current generated by the voltage-to-current converter. The drain terminal of the first transistor is coupled to a first output node of the voltage detector. The second transistor has a gate terminal that receives the first voltage and, in response, generate a second current that is equal to a scaled replica of the first current generated by the voltage-to-current converter. The drain terminal of the second transistor is coupled to a second output node of the voltage detector. The third transistor has a gate terminal that receives a second voltage generated by the voltage-to-current converter, and in response, generates a third current that is a scaled replica of the second current generated by the voltage-to-current converter. The drain terminal of the third transistor is coupled to the first output node of the voltage detector. The fourth transistor has a gate terminal that receives the second voltage and, in response, generates a fourth current that is a scaled replica of the second current generated by the voltage-to-current converter. The drain terminal of the fourth transistor is coupled to the second output node of the voltage detector. Each of the first and second output nodes is a high impedance node.

In some embodiments, if for example, both the first and second output nodes are at a first voltage level, the voltage detector detects a first out-of-range condition, e.g., the closed loop control voltage is smaller than the lower limit of the loop's voltage range. If, for example, both the first and second output nodes are at a second voltage level, the voltage detector detects a second out-of-range condition, e.g., the closed loop control voltage is smaller than the lower limit of the loop's voltage range. If, for example, the first output node is at a first voltage level, and the second output node is at a second voltage level, the voltage detector detects that closed-loop voltage is within the lower and upper limits of the loop's voltage range.

In accordance with another embodiment of the present invention, the voltage detector is adapted to include N programmable current mirrors each receiving a programmable bit to determine which one of the equal division of the loop's voltage range matches the closed loop voltage. To achieve this, each programmable current mirror delivers its current to an output node via a different one of N current paths. In some embodiments, the $m^{th}$ current path is adapted to generate a current having a size that is equal to $½^m$ of a current supplied by a voltage-to-current converter coupled to the voltage detector. The voltage detector also includes a current mirror that mirrors another current flowing in the voltage-to-current converter and draws current from the output node. To determine which one of the equal division of the loop's voltage range matches the closed loop voltage, the logic states of the programmable bits are varied to determine their effects on the output node voltage.

DETAILED DESCRIPTION OF THE INVENTION

Figure 6:
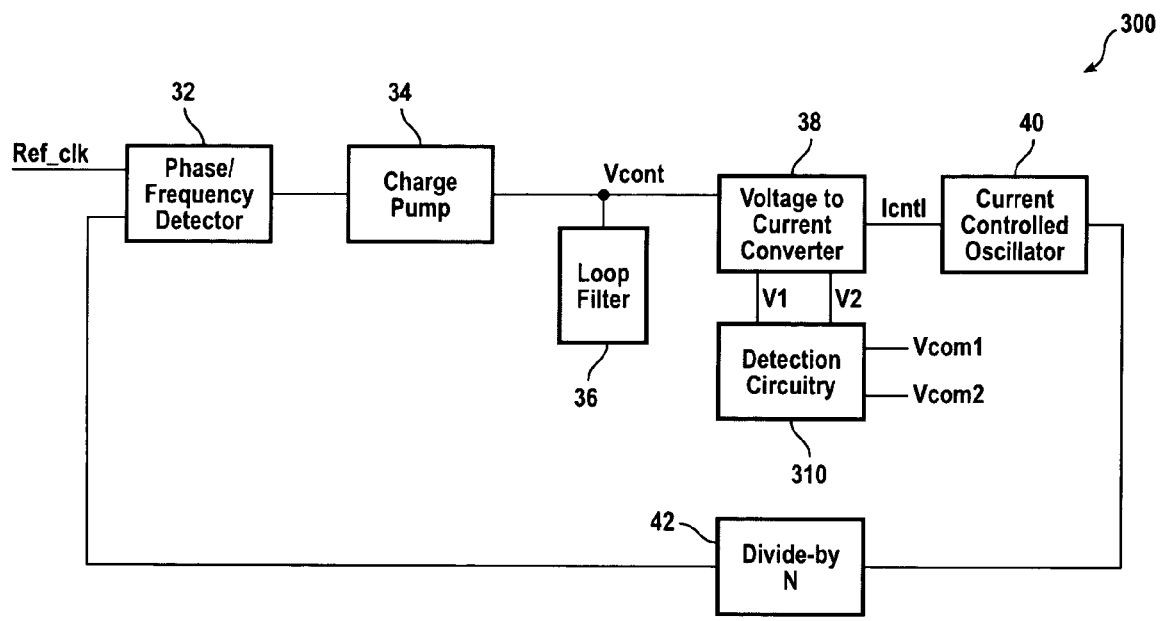
FIG. 6 is a simplified block diagram of a phase/frequency locked loop having disposed therein a voltage detection circuitry, in accordance with one embodiment of the present invention.

FIG. 6 is a simplified block diagram of a PLL 300 that includes, among other components, a phase/frequency detector 32, a charge pump 34, a loop filter 36, a voltage to current (VTI) converter 38, a current controlled oscillator (ICO) 40, and detection circuitry 310. Detection circuitry 310, in accordance with the present invention, receives voltage signals V1 and V2 from VTI converter 38 and generates voltage signals Vcom1, and Vcom2. Voltage signals Vcom1 and Vcom2 are applied to high-impedance nodes, e.g., to gate terminals of MOS transistors disposed in CMOS inverters, and indicate whether PLL 300 is out of a predefined tuning range. In other words, signals Vcom1 and Vcom2 detect whether an out-of-range condition is present in the loop. For example, a relatively low voltage level on signal Vcom1 indicates that voltage Vcont is greater than the upper range of PLL 30's tuning range. Similarly, a relatively high voltage level on signal Vcom2 indicates that voltage Vcont is smaller than the lower range of PLL 30's tuning range. Phase detector 32, charge pump 34, low-pass filter 36, and ICO 40 are known and are not described below.

Figure 1:
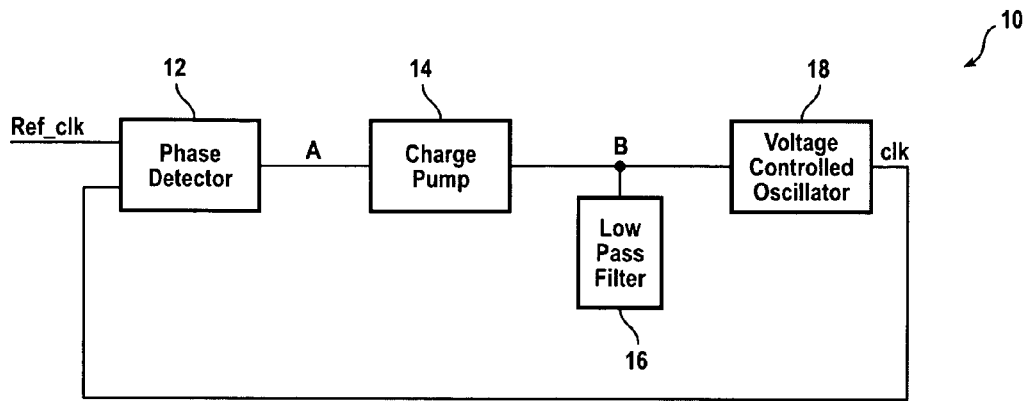
FIG. 1 is a simplified block diagram of a phase/frequency locked loop, as known in the prior art.
Figure 2:
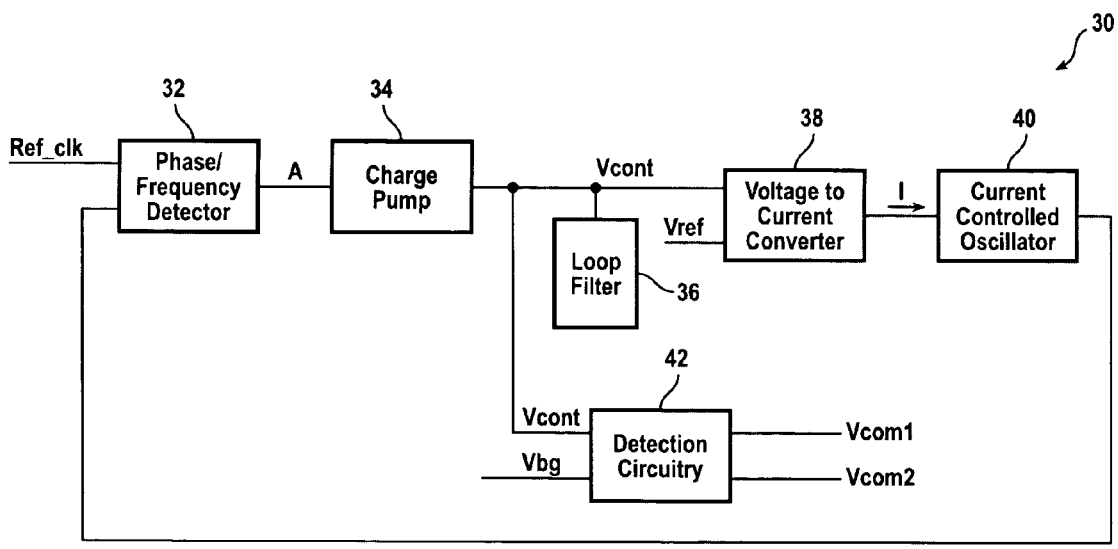
FIG. 2 is a simplified block diagram of another phase/frequency locked loop having disposed therein a voltage detection circuitry, as known in the prior art.
Figure 3:
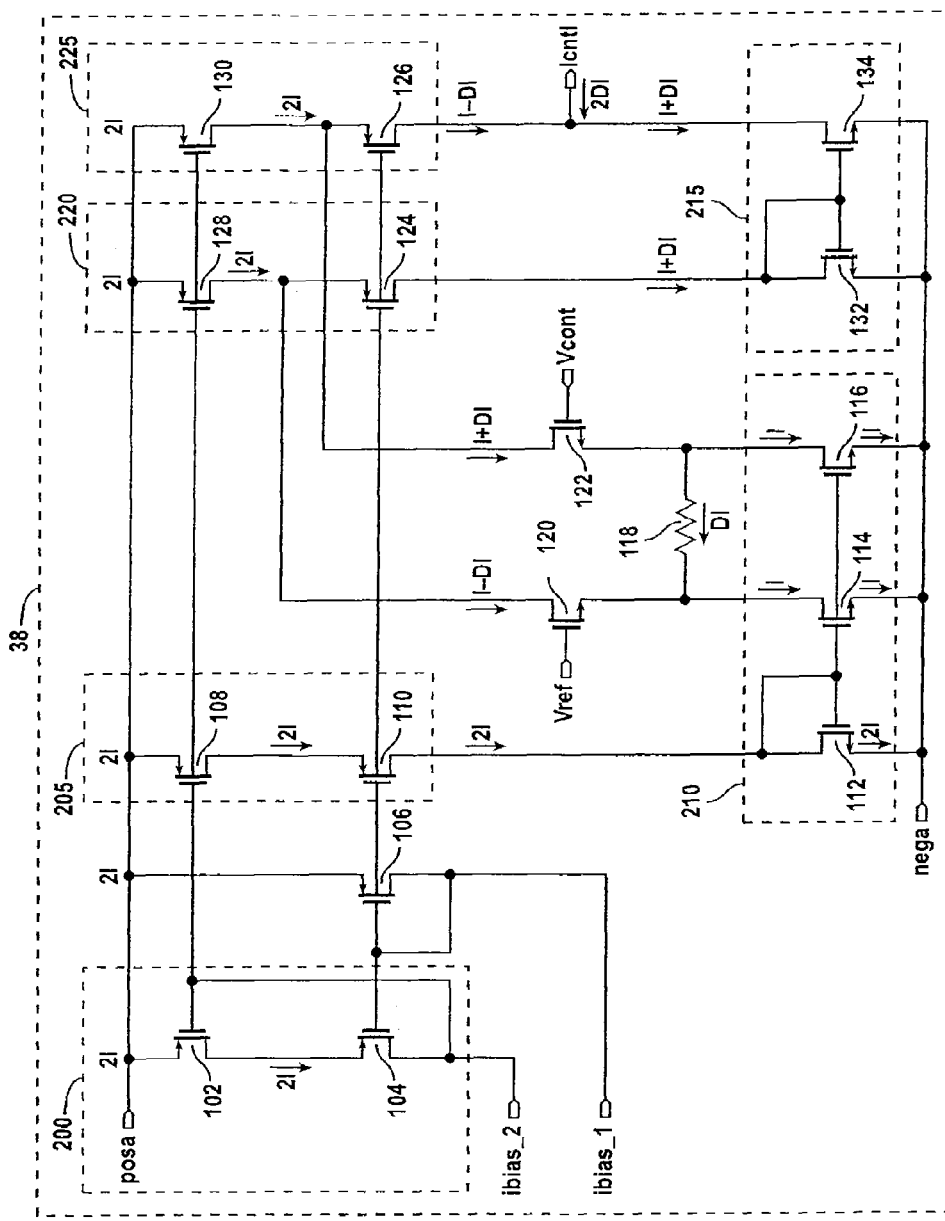
FIG. 3 is a transistor schematic diagram of the voltage-to-current converter disposed in the phase/frequency locked loop of FIG. 2, as known in the prior art.
Figure 4:
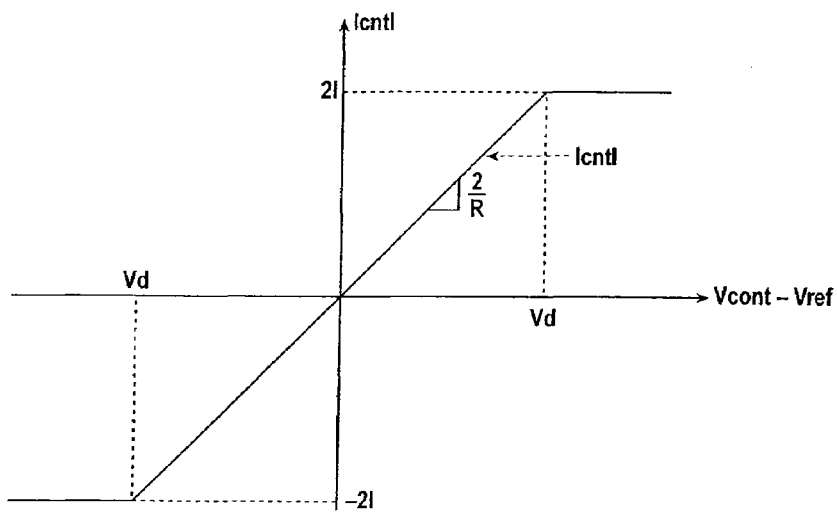
FIG. 4 shows the change in the current flowing through the output terminal of the voltage-to-current converter of FIG. 2, as a function of the difference between the applied voltages.
Figure 5:
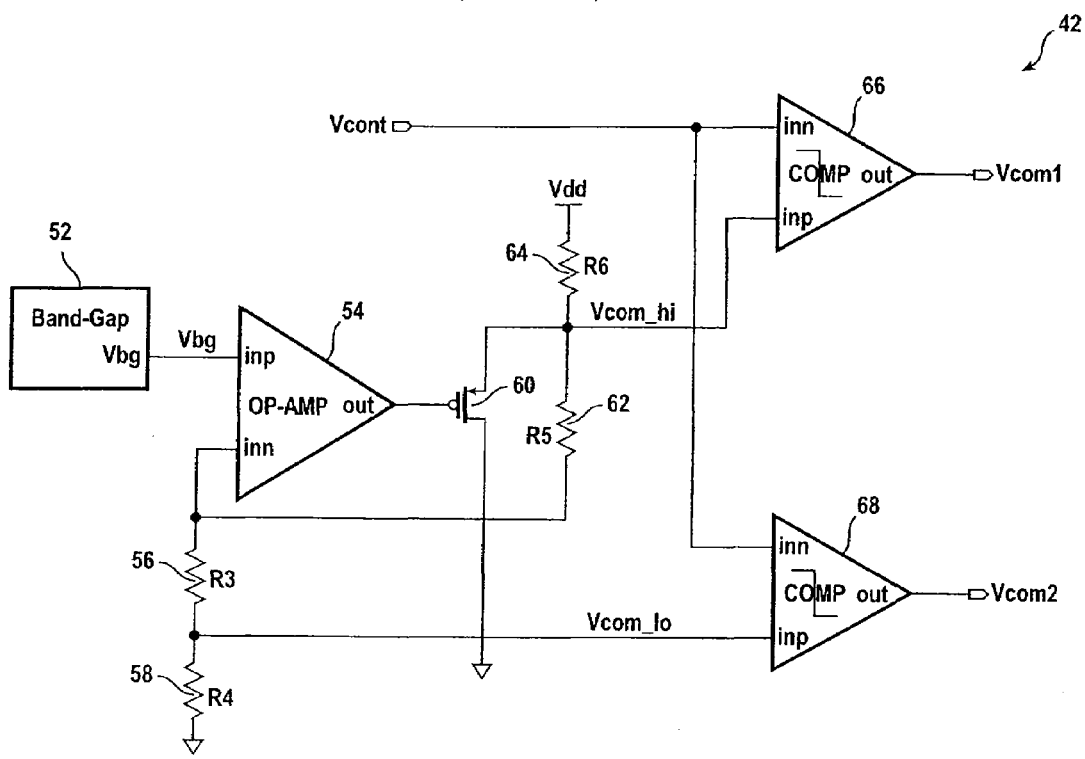
FIG. 5 is a block diagram of the voltage detection circuitry disposed in the phase/frequency locked loop of FIG. 2, as known in the prior art.
Figure 7:
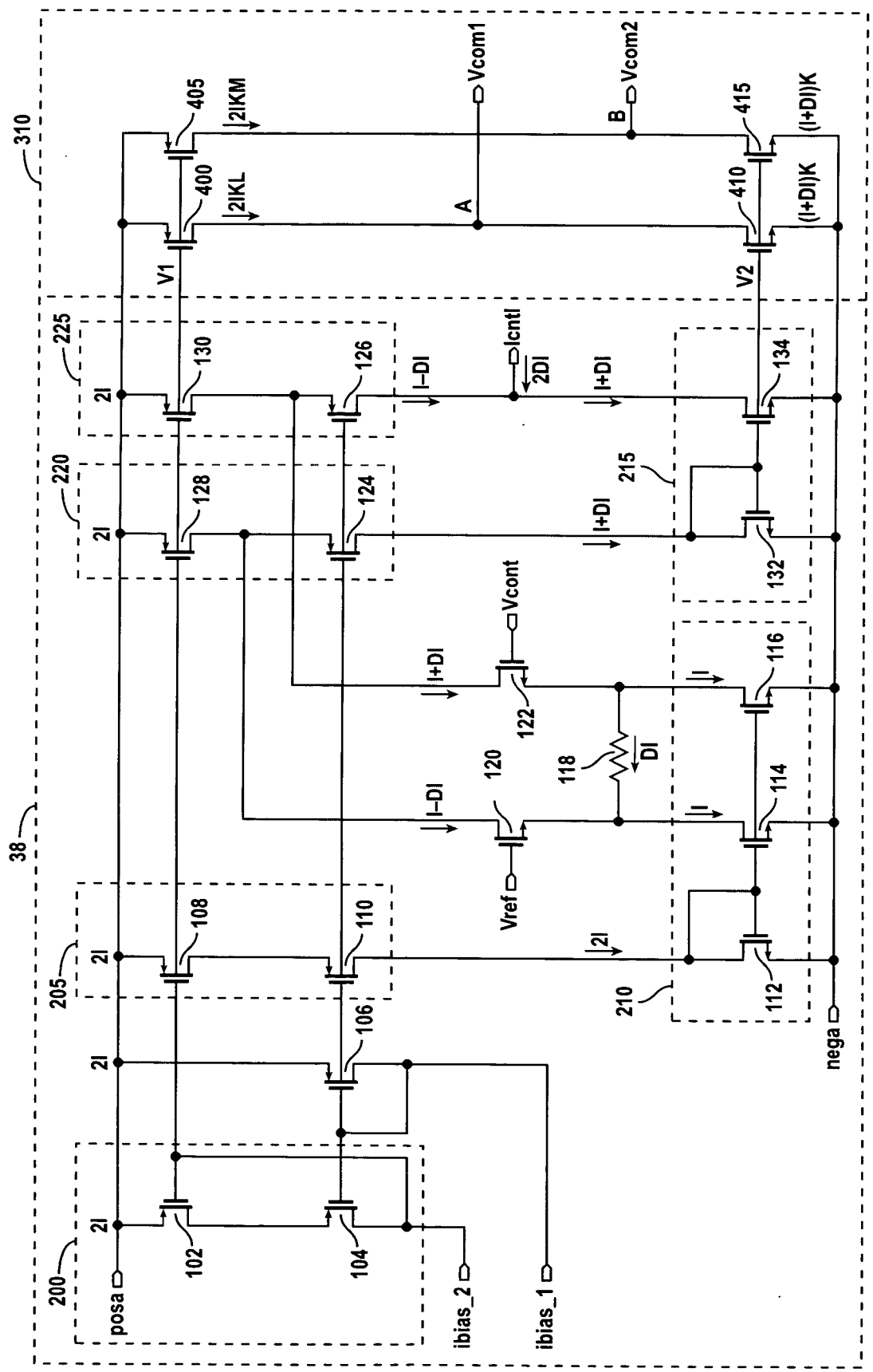
FIG. 7 is a transistor schematic diagram of the voltage-to-current converter coupled to a voltage detection circuitry, in accordance with one embodiment of the present invention.

FIG. 7 is a transistor schematic diagram of VTI circuit 38 coupled to detection circuitry 310 of the present invention. Detection circuitry 310 is adapted to detect whether voltage Vcont is within or outside a range defined by the loop's tuning range. It is understood that the tuning range defines the range in which the PLL, or any other close loop circuitry, such a delay locked-loop or frequency locked loop, remains in the closed loop state. In other words, for example, PLL 300 no longer operates in a closed-loop mode if the voltage Vcont is outside the PLL's tuning range. In FIG. 4, the tuning range is defined by ±Vd. VTI circuit 38 receives voltage signals Vref and Vcnt and, in response, generates current signal Icntl, and voltage signals V1 and V2. Current signal Ibias_1 biases transistor 106, and current signal Ibias_2 biases the transistors disposed in current source 200. VTI circuit 38 is shown as including a differential amplifier formed by transistors 120, 122 and resistor 118, current source 200, current mirrors 205, 210, 215, 220, 225, and biasing transistor 106. To ensure robustness, the closed-loop voltage of a PLL is typically adapted to operate within, for example, 80% of the PLL's tuning range.

Current source 200, which is a cascade current source generates a current of 2I that flows through PMOS transistors 102, 104. Current mirrors 205, 220, and 225 mirror this current, and therefore, a current of 2I also flows through PMOS transistors 108, 128, and 130. Part of the current 2I mirrored in transistor 128 flows through PMOS transistor 124—shown as current I+DI—the remainder of this current flows through transistor 120—shown as current I−DI. Similarly, part of the current 21 mirrored in PMOS transistor 130 flows through transistor 126—shown as current I−DI—the remainder of this current flows through NMOS transistor 122—shown as current I+DI. Because the same current flows through both PMOS transistor 124 and NMOS 132, a current of I+DI flows through transistor 132. Moreover, because the same current flows through NMOS transistors 132, and 134, a current of I+DI flows through transistor 134.

If voltage Vcont is greater than voltage Vref, more current flows through transistor 122 and less current flows through transistor 120. Similarly, if voltage Vcont is smaller than voltage Vref, more current flows through transistor 120 and less current flows through transistor 122. It is understood that depending on the relative sizes of voltages Vcont and Vref, shown current DI may have a positive or a negative value. The difference 2DI between current I−DI flowing through transistor 126 and current of I+DI flowing through transistor 134, flows to terminal Icntl if DI is negative, or from terminal Icntl if DI is positive. Therefore, the difference between voltages Vcont and Vref, results in a change in the current 2DI flowing into or out of terminal Icntl.

VTI circuit 38 generates first and second voltages V1, and V2 that are applied to detection circuit 310. Detection circuit 310 is shown as including PMOS transistors 400, 405, and NMOS transistors 410, and 415. PMOS transistor 400 may have a channel-width to channel-length ratio, i.e., W/L, selected to be L times the W/L ratio of transistor 102. Similarly, PMOS transistor 405 may have a W/L ratio selected to be M times the W/L ratio of transistor 102. It is understood that L and M may be equal to 1. Moreover, each of transistors 400, and 405 may be scaled so as to have additional current driving capability that is K times the current driving capability of transistor 102, and each of transistors 410, and 415 may be scaled so as to have current driving capability that is K times the current driving capability of transistor 132. For example, scaling of PMOS transistor 400 may be achieved by connecting a number of such transistors in parallel. Therefore, transistors 400 may be selected to have a driving capability of KL times the driving capability of transistor 102. Transistors 405 may be selected to have a driving capability of KM times the driving capability of transistor 102. Transistors 410, and 415 may each be selected to have a driving capability of K times the driving capability of transistor 132. Accordingly, all four transistors 400, 405, 410, and 415 may be scaled by the same factor K.

Consequently, if current 2I flows through transistor 102 and current I+DI flows through transistor 132, current 2I*KL flows through transistor 400, current 2I*KM flows through transistor 405, and current (I+DI)*K flows through each of transistors 410, and 415. Because node A carrying voltage signal Vcom1 is a high impedance node, if the current flow through transistor 400 is greater than the current flow through transistor 410, node A is pulled to the positive supply voltage Posa. If the current flow through transistor 400 is smaller than the current flow through transistor 410, node A is pulled to the negative supply voltage Nega. Similarly, because node B carrying voltage signal Vcom2 is also a high impedance node, if the current flow through transistor 405 is greater than the current flow through transistor 415, node B is pulled to the positive supply voltage Posa. If the current flow through transistor 405 is smaller than the current flow through transistor 415, node B is pulled to the negative supply voltage Nega.

By decoding the voltages on nodes A and B, detection circuit 30 detects whether an out-of range condition is present. For example, if both voltages Vcom1 and Vcom2 are at supply voltage Posa, an out-of-range condition is detected thus indicating that the loop voltage Vcont is smaller than the lower tuning range of the PLL. Similarly, if for example, both voltages Vcom1 and Vcom2 are at supply voltage Nega, an out-of-range condition is detected thus indicating that the loop voltage Vcont is greater than the upper tuning range of the PLL. If, for example, voltage Vcom1 is at supply voltage Posa and Vcom2 is at supply voltage Nega, no out-of-range condition is detected indicating that the loop voltage Vcont is within the lower and upper tuning range of the PLL. It is understood that in a differential closed-loop, charge pump 34 is a differential charge pump outputting a pair of differential signals, thus causing a pair of differential voltages (not shown), in place of voltages Vcont and Vref, to be applied to the gate terminals of transistors 120, and 122.

Figure 8:
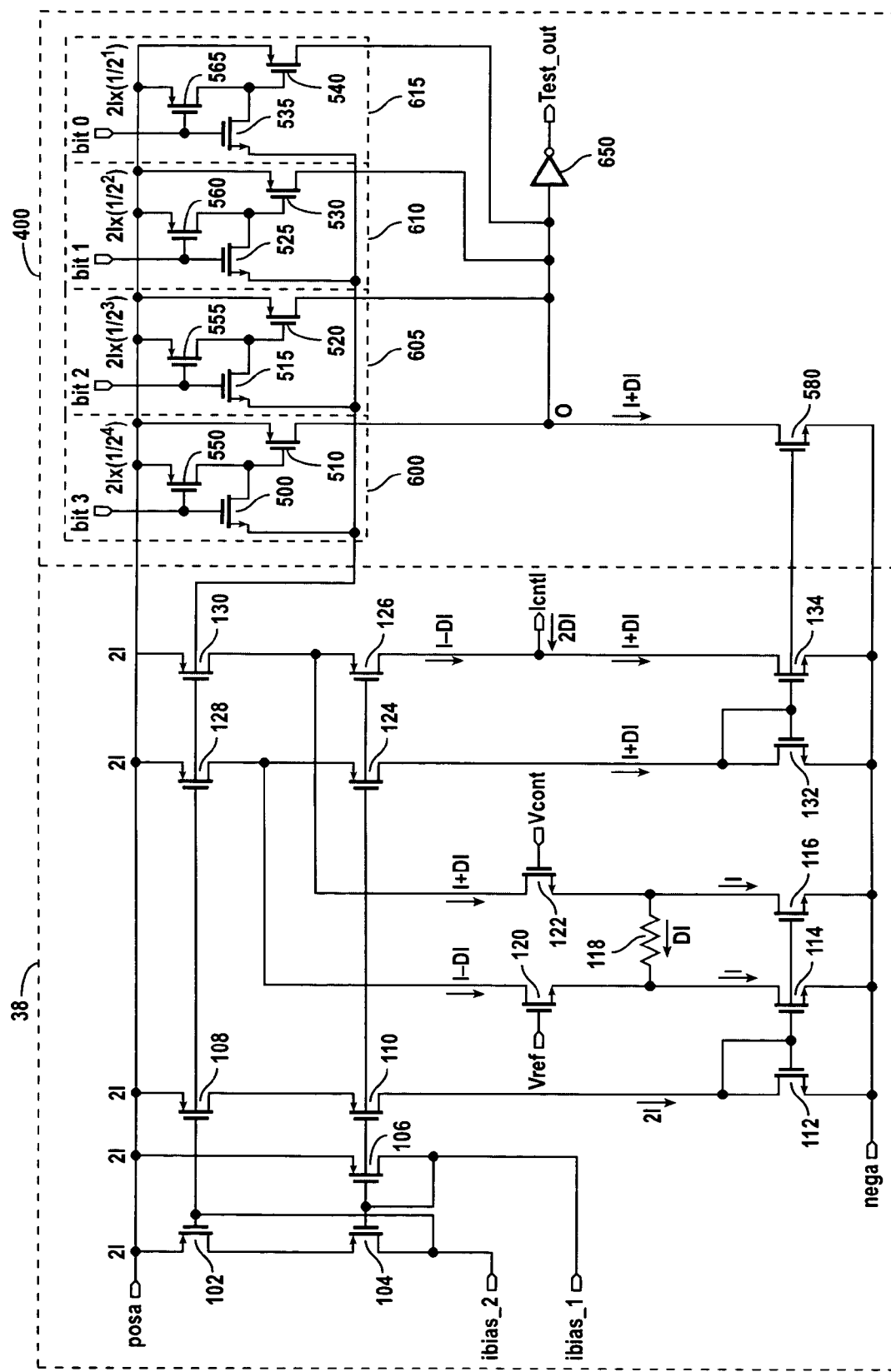
FIG. 8 is a transistor schematic diagram of the voltage-to-current converter coupled to a voltage detection circuitry, in accordance with another embodiment of the present invention.

FIG. 8 is a transistor schematic diagram of VTI circuit 38 coupled to detection circuitry 400, in accordance with another embodiment of the present invention. Detection circuitry 400 is adapted to divide the closed loop's tuning range into an even and equal number of divisions and identify the division in which closed loop control voltage (hereinafter alternatively referred to as closed loop voltage or control voltage) Vcont falls. Detection circuitry 400 is shown as including four programmable current mirrors, namely programmable current mirrors 600, 605, 610, and 615. Programmable current mirrors 600, 605, 610, 615 are respectively programmed using bits bit_3, bit_2, bit_1, and bit_0, thus enabling the ratio of the current flowing through these current mirrors compared to that flowing through transistor 580, to be binary weighted so as to digitize the relative position of the closed loop voltage. The accuracy of the position is dictated only by the matching of the current mirrors. As described above, the digitized value of the loop voltage may be used for diagnostic, calibration or for gain control purposes.

Programmable current mirror 615 includes PMOS transistors 565 and 540 and NMOS transistor 535. The gate terminals of transistors 535 and 565 receives the bit_0 voltage signal. The source terminal of transistor 535 is coupled to the gate terminal of transistor 102. The drain terminal of transistor 565 is coupled to the drain terminal of transistor 535 and to gate terminal of transistor 540. The source terminal of transistor 565 is coupled to the positive supply voltage Posa. The drain terminal of transistor 540 is coupled to the drain terminal of transistor 580. The gate terminal of transistor 580 is coupled to the gate terminals of transistors 132, 134. The source terminal of transistor 580 is coupled to the supply terminal Nega. Programmable current mirrors 600, 605 and 610 are similar to programmable current mirror 615.

Voltage detection circuitry 400 is shown as receiving four programmable bits. Accordingly, it is adapted to determine in which of the 16 equal divisions of the closed-loop's tuning range, the closed loop voltage Vcont falls. It is understood that a voltage detection circuitry, in accordance with the present invention, may include more or fewer programmable current mirrors than 4. In general, if voltage detection circuitry 400 is adapted to include N such programmable current mirrors, the closed-loop's voltage range is divided into $2^N$ equal divisions. This enables the determination and matching of the closed loop voltage Vcont to one of the $2^N$ voltage divisions of the closed-loop's voltage range. In other words, the closed loop voltage may be determined with a resolution of $2^N$.

Figure 9:
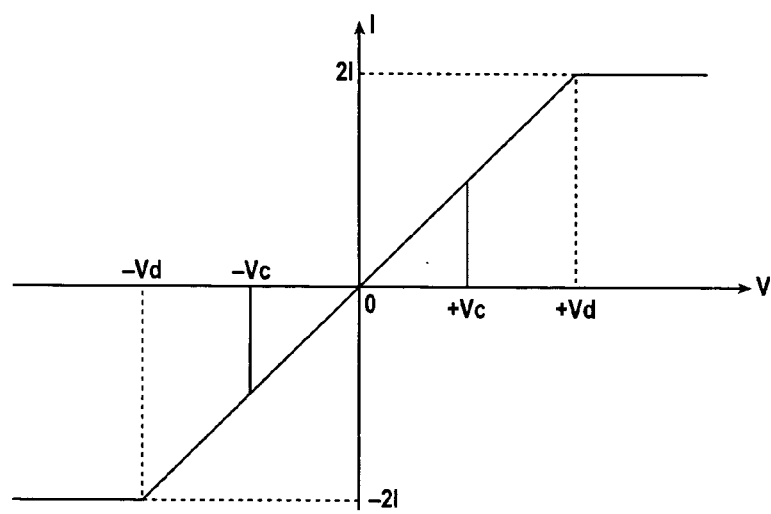
FIG. 9 shows the closed-loop voltage range divided into four equal divisions.

Assume that it is decided to determine which one of the four voltage divisions of the loop's voltage range matches the loop voltage Vcont. FIG. 9 shows that the loop's voltage range as being divided into 4 equal parts. In other words, it is decided to determine whether:

$-Vd \leq VCO \prec -Vc$ or $-Vc \leq VCO \prec 0$ or $0 \leq VCO \prec Vc$ or $Vc \leq VCO \prec Vd$ To determine this, bits bit_2 and bit_3 are set and maintained at 0 and are not changed thereafter. Each of bit_0 and bit_1 is also initially set to 0. Therefore, in programmable current mirror 615, transistor 535 is turned off and transistor 565 is turned on, thereby causing PMOS transistor 540 to be off (i.e., in non-conductive state). Because bit_1 is also equal to 0, transistor 530 of programmable current mirror 610 is also off. For similar reasons transistors 510 and 520 are also off. Therefore, no current flows to node O via transistors 510, 520, 530, and 540. This, in turn, causes transistor 580 to pull node O to ground. Next, bit_0 is set to 1, and bit_1 is maintained at 0. This causes transistor 540 to conduct current and transistor 530 to remain off. Programmable current mirror 615 is selected such that the current through transistor 540 when this transistor is in a conducting state, is equal to ½ of the current flow through transistor 102. Accordingly, because it is assumed that the current flow through transistor 102 is equal to 2I, the current flow through transistor 540 is equal to I. Because the current flow through transistor 132 is equal to I+DI, the current flow through transistor 580 is also equal to I+DI. Therefore, assuming DI is positive and is less than 0.5I, the current flow through transistor 540, namely I, is less than the current flow through transistor 580, namely I+DI. This causes node D to be at the Nega voltage potential.

It is understood that node O is a high impedance node. In FIG. 8, node O is shown as being coupled to the input terminal of inverter 650 generating an output voltage Test_out used in the detection of the VCO voltage. It is understood that in other embodiments, node O may be coupled to another device.

Next, bit_0 is set to 0, and bit_1 is set to 1. This causes transistor 530 to conduct current and transistor 540 not to conduct current. Programmable current mirror 615 is selected such that the current through transistor 530 when this transistor is in a conducting state, is equal to ¼ of the current flow through transistor 102. Accordingly, because it is assumer that the current flow through transistor 102 is equal to 2I, the current flow through transistor 540 is equal to ½I. Because the current flow through transistor 132 is equal to I+DI, the current flow through transistor 580 is also equal to I+DI. Therefore, assuming DI is positive, the current flow through transistor 540, namely ½I, is less than the current flow through transistor 580, namely I+DI. This causes node D to be at the Nega voltage potential.

Next, bit_0 and bit_1 are both set to 1. This causes transistors 530 and 540 to conduct current. Accordingly, the current flowing to node O is equal to 1.5I, while the current flowing out of node O to transistor 580 is I+DI. Because DI is assumed to be less than 0.5I, node O is pulled to the positive supply voltage Posa, therefore, indicating that the closed loop voltage Vcont is between voltages Vc and Vd, as seen in FIG. 9.

It is understood, that in the above exemplary embodiment, depending on the voltage Vcont, the relative size of DI compared to I varies. Thus depending on the voltage Vcont, different combinations of bit_0 and bit_1 may cause node D to be pulled up to the supply voltage Posa or pulled down to the supply voltage Nega in accordance with another combination of bit_0 and bit_1.

It is also understood that if it is decided to determine the closed loop voltage Vcont using a 4-bit resolution, i.e., to determine which one of the sixteen equal division of the loop's voltage range matches this voltage, all the 16 combinations of the four bits bit_0, bit_1, bit_2, and bit_3 are used. Therefore, bits bit_2 and bit_3 are also varied. It is further understood that to determine the closed loop voltage Vcont using an N-bit resolution, i.e., to determine which one of the $2^N$ equal division of the loop's voltage range matches this voltage, N programmable current mirrors similar to those shown in FIG. 8 is used.

The above embodiments of the present invention are illustrative and not limiting. Various alternatives and equivalents are possible. The invention is not limited by the type of the closed control loop, e.g. phase locked loop, delay-locked loop, or otherwise, which may use the voltage detection circuitry, in accordance with the present invention. The invention is not limited by the number of programmable current mirrors used to detect the position of the closed loop voltage within the closed loop's range. The invention is not limited by the type of the voltage-to-current converter that supplies voltages to the voltage detection circuitry of the present invention. The invention is not limited by the frequency of the reference or the oscillator clock signals. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present invention and are intended to fall within the scope of the appended claims.

What is claimed is:

1. A voltage detector coupled to a voltage-to-current converter and adapted to receive a first voltage and a second voltage generated by the voltage-to-current converter, the voltage detector comprising:
   a first transistor having a gate terminal adapted to receive the first voltage and generate a first current that mirrors a second current generated by the voltage-to-current converter; wherein the first transistor is adapted to generate the first current that is equal to a first scaled replica of the second current, wherein a drain terminal of the first transistor is coupled to a first output node of the voltage detector;
   a second transistor having a gate terminal adapted to receive the first voltage and generate a third current that mirrors the second current generated by the voltage-to-current converter; wherein the second transistor is adapted to generate the third current that is equal to a second scaled replica of the second current, wherein a drain terminal of the second transistor is coupled to a second output node of the voltage detector;
   a third transistor having a gate terminal adapted to receive the second voltage and generate a fourth current that mirrors a fifth current generated by the voltage-to-current converter; wherein the third transistor is adapted to generate the fourth current that is equal to a scaled replica of the fifth current, wherein a drain terminal of the third transistor is coupled to the first output node of the voltage detector and
   a fourth transistor having a gate terminal adapted to receive the second voltage and generate a sixth current that mirrors the fifth current generated by the voltage-to-current converter; wherein the fourth transistor is adapted to generate the sixth current that is equal to the scaled replica of the fifth current, and wherein a drain terminal of the fourth transistor is coupled to the second output node of the voltage detector, wherein each of said first and second output nodes is a high impedance node, and wherein if the first output node is at a first voltage level and said second output node is at a second voltage level, said first detector detects a first out-of-range condition, and wherein if the first output node is at a second voltage level and said second output node is at a first voltage level, said first detector detects a second out-of-range condition.

2. The voltage detector of claim 1 wherein said first scale factor comprises channel-width to channel-length ratio of the first transistor to channel-width to channel-length ratio of a fifth transistor of a current source disposed in the voltage to current converter.

3. The voltage detector of claim 2 wherein said second scale factor comprises channel-width to channel-length ratio of the second transistor to channel-width to channel-length ratio of the fifth transistor of the current source disposed in the voltage to current converter.

4. The voltage detector of claim 3 wherein said first scale factor is different from said second scale factor and wherein said first and second scale factors are different from said third scale factor.

5. A method of detecting whether a voltage is outside a predefined range, the method comprising:
   generating a first current having a size that is equal to a first proportion of a second current, said first current flowing to a first output node that is a high impedance node;
   generating a third current having a size that is equal to a second proportion of the second current and flowing to a second output node that is a high impedance node;
   generating a fourth current having a size that is equal to a third proportion of a fifth current, said fifth current flowing out of the first output node; and
   generating a sixth current having a size that is equal to a fourth proportion of the fifth current, said sixth current flowing out of the second output node; wherein said first and second output nodes carry first and second output voltages that together determine whether the voltage is out of the predefined range.

6. The method of claim 5 wherein said third proportion of the fifth current is equal to said fourth proportion of the fifth current.

7. The method of claim 6 wherein each of the first, second, third, and fourth currents is adapted to be scaled up or down by a same scale factor.

8. The method of claim 7 wherein said first proportion of the second current is different from said second proportion of the second current.

* * * * *